(12) United States Patent
Saran

(10) Patent No.: US 7,534,630 B2
(45) Date of Patent: May 19, 2009

(54) METHOD OF IMPROVING POWER DISTRIBUTION IN WIREBOND SEMICONDUCTOR PACKAGES

(75) Inventor: Mukul Saran, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 11/557,190

(22) Filed: Nov. 7, 2006

(65) Prior Publication Data

US 2007/0087476 A1 Apr. 19, 2007

Related U.S. Application Data

(62) Division of application No. 10/928,016, filed on Aug. 27, 2004, now Pat. No. 7,151,309.

(51) Int. Cl.
*H01L 21/66* (2006.01)

(52) U.S. Cl. .......................................... 438/14; 438/106

(58) Field of Classification Search ................ 438/15, 438/25, 26, 106, 617; 257/E33.141, E33.033
See application file for complete search history.

(56) References Cited

U.S. PATENT DOCUMENTS

| 6,667,546 B2 * | 12/2003 | Huang et al. ............... 257/691 |
| 6,873,040 B2 | 3/2005 | Howard et al. |
| 6,979,909 B2 * | 12/2005 | Shinohara .................. 257/796 |
| 7,291,928 B2 * | 11/2007 | Yamada et al. ............ 257/784 |
| 2001/0050422 A1 * | 12/2001 | Kishimoto et al. ......... 257/678 |
| 2003/0089983 A1 * | 5/2003 | Huang et al. ............... 257/738 |

* cited by examiner

*Primary Examiner*—Thao P. Le
(74) *Attorney, Agent, or Firm*—Yingsheng Tung; Wade J. Brady, III; Frederick J. Telecky, Jr.

(57) ABSTRACT

A semiconductor package comprising a die adjacent a substrate, a supporting plate adjacent the die, and a conducting plate abutting the supporting plate and electrically coupled to a metal apparatus adjacent the substrate and the die using a plurality of bond wires. The metal apparatus supplies power to the conducting plate.

5 Claims, 4 Drawing Sheets

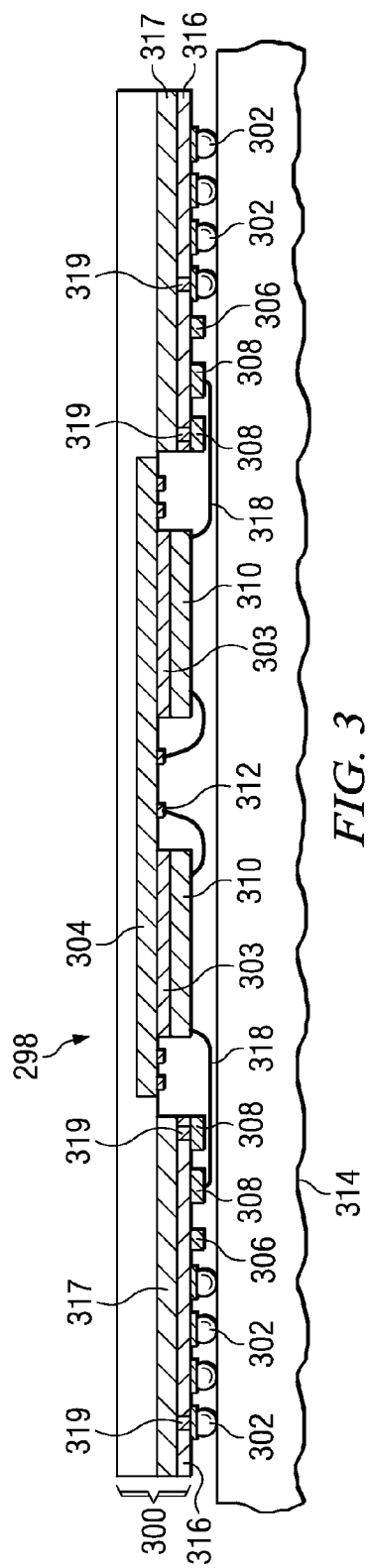
FIG. 3
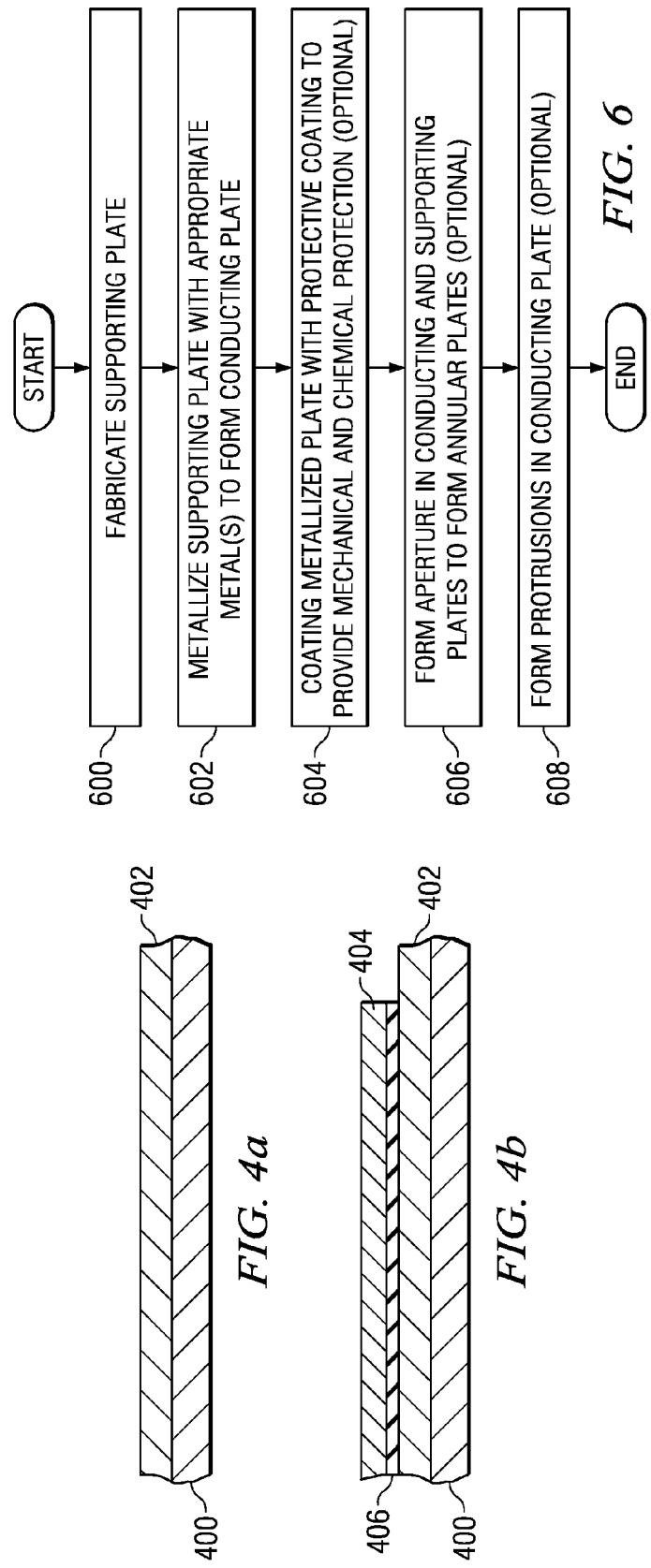
FIG. 4a
FIG. 4b
FIG. 6

METHOD OF IMPROVING POWER DISTRIBUTION IN WIREBOND SEMICONDUCTOR PACKAGES

This is a divisional of application Ser. No. 10/928,016 filed Aug. 27, 2004, now U.S. Pat. 7,151,309, the contents of which are herein incorporated by reference in its entirety.

BACKGROUND

A wirebond semiconductor package comprises an integrated circuit ("IC") electrically coupled to a package substrate using bond wires. In turn, the package substrate is electrically coupled to a circuit board using solder balls. In this way, multiple electrical connections are established between the integrated circuit and the circuit board. An IC in a wirebond package may require access to one or more voltage levels. For example, the IC may require access to voltage sources of 1.1 V, 3.3 V, and 5 V, in addition to a ground connection.

To this end, wirebond package substrates comprise multiple metal planes (i.e., layers). Each of these metal planes may carry a different voltage level. For example, one metal plane may carry a 3.3 V potential and another may carry a 0.0 V (i.e., ground) potential. Each of these metal planes may be electrically coupled to metal rings abutting (e.g., metallized on) the package substrate and surrounding the IC, called a power ring. Each power ring makes accessible to the IC a voltage potential found on a metal plane coupled to that power ring. For example, the IC may access a 5 V source by way of a power ring that is electrically coupled to a 5 V metal plane.

The IC accesses the power rings using fine-pitch bond wires. However, because these fine-pitch bond wires are substantially narrow and long, the bond wires carry a considerably high inductance that may compromise signal integrity. Also, in wirebond packages that do not support multiple planes in the substrate, substantially long, narrow metal traces may be used to carry electrical signals from solder balls to the power rings. Such long, narrow metal traces also carry substantial levels of inductance that may negatively impact signal quality. Finally, the power delivery to the core of the die requires long traces from bond pads generally arranged on the die periphery to the core regions of the die. These traces cause voltage (IR) drops and loss of signal integrity.

SUMMARY

The problems noted above are solved in large part by an apparatus for improved power distribution in wirebond packages. In an exemplary embodiment, a semiconductor package comprises a die adjacent a substrate, a supporting plate adjacent the die, and a conducting plate abutting the supporting plate and electrically coupled to a metal apparatus adjacent the substrate and the die using a plurality of bond wires. The metal apparatus supplies power to the conducting plate.

In another exemplary embodiment, a semiconductor package comprises a die adjacent a substrate and a conducting plate electrically connected to the die using at least one of solder bumps or stud bumps. The conducting plate has at least one protrusion exposed through the package mold compound, wherein the protrusion is adapted to be electrically coupled to a power source using a cable.

In yet another exemplary embodiment, a method of distributing power in a package comprises electrically coupling a conducting plate to a die using at least one of solder bumps or stud bumps, the conducting plate comprising at least one protrusion exposed through the package mold compound, and electrically coupling the protrusion to a power source on a circuit board using a cable.

In still another exemplary embodiment, a method of distributing power in a semiconductor package comprises electrically coupling a conducting plate to a power source adjacent a substrate, the conducting plate abutting a supporting plate adjacent the substrate, and electrically coupling the conducting plate to bond pads on a die fixed between the substrate and the supporting plate using a plurality of bond wires.

BRIEF DESCRIPTION OF THE DRAWINGS

For a detailed description of exemplary embodiments of the invention, reference will now be made to the accompanying drawings in which:

FIG. 3 shows a cross-sectional side view of a cavity-down configuration of the embodiment shown in FIGS. 1 and 2a, in accordance with embodiments of the invention;

FIG. 4a shows a cross-sectional side view of a conducting plate abutting a supporting plate, in accordance with embodiments of the invention;

FIG. 4b shows a cross-sectional side view of a first conducting plate adjacent a second conducting plate with a supporting substance (e.g., adhesive) fixed therebetween, and a supporting plate abutting the second conducting plate, in accordance with embodiments of the invention;

FIG. 6 shows a process that may be used to fabricate supporting plates and the metal apparatus, in accordance with embodiments of the invention.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, in the discussion and in the claims, the term "couple" or "couples" is intended to mean either an indirect or direct electrical connection. Thus, if a first device couples to a second device, that connection may be through a direct electrical connection, or through an indirect electrical connection via other devices and connections. Further, the terms "annulus" and/or "annular," as used in all portions of this document including the specification, drawings and claims, pertain to an enclosed structure that may be any of a variety of shapes or forms, such as circular, rectangular, triangular, irregular, and so forth. Also, a "conducting plate" as used below may be interpreted to mean any type of electrically conductive apparatus or device. "Adjacent" may be defined as "in relatively close proximity to." The term "abutting" may be defined as "immediately next to."

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Presented herein are various embodiments of a metal apparatus fixed adjacent to a wirebond package IC that may be used to supply voltage to the IC. Specifically, the metal apparatus may be supplied with a voltage (e.g., 5 V) by coupling the metal apparatus to a package substrate or to a circuit board electrically coupled to the substrate. The metal apparatus may be coupled to the substrate or the circuit board using multiple wires and/or cables of substantially larger diameters than that of fine-pitch bond wires. In turn, the IC may be supplied with this voltage by coupling the IC to the metal apparatus. In this way, the IC may be provided with any of a variety of voltages while preserving signal integrity.

Figure 1:
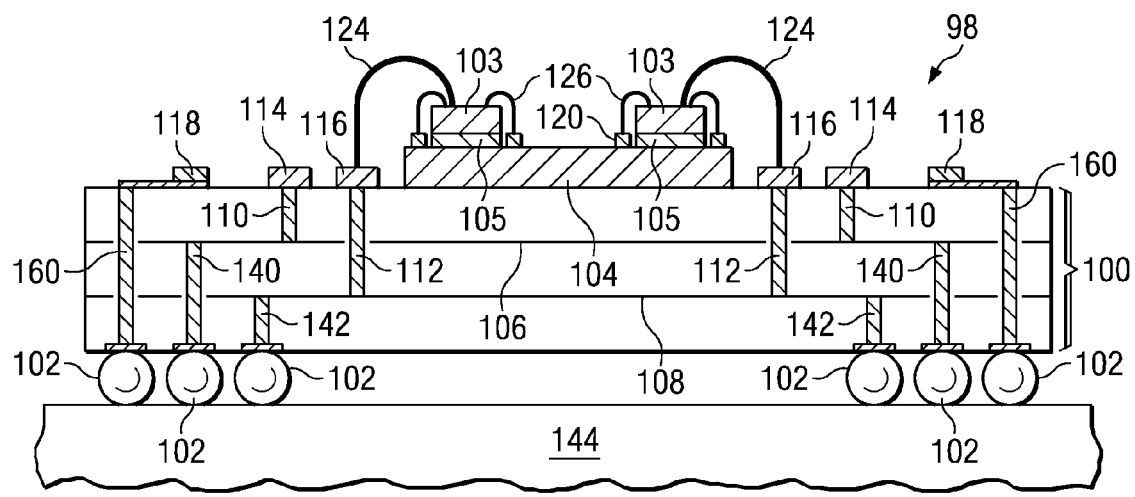
FIG. 1 shows a cross-sectional side view of a metal apparatus electrically coupled to a package substrate, in accordance with embodiments of the invention.

FIG. 1 shows a cross-sectional side view of a wirebond package 98 comprising a substrate 100, solder bumps 102 abutting the substrate 100, a die 104 abutting the substrate 100, a supporting plate 105 abutting the die 104, and a conducting plate 103 abutting the supporting plate 105. Not all of these structures need be included in all embodiments. For example, in some embodiments, the supporting plate 105 can be omitted. In at least some embodiments, the conducting plate 103 and the supporting plate 105 may be substantially annular (e.g., rectangular, circular, triangular, irregular) in shape. As mentioned above, the conducting plate 103 may be any electrically conductive apparatus or device. The substrate 100 may comprise a power metal plane 106, a power metal plane 108, vias 110, 140 coupled to the power metal plane 106, vias 112, 142 coupled to the power metal plane 108, a power ring 114 coupled to the vias 110, and a power ring 116 coupled to the vias 112. The vias 140, 142 may be electrically coupled to a circuit board 144 by way of the solder bumps 102.

The substrate 100 may further comprise multiple bond fingers 118 electrically coupled to at least some of the solder balls 102 by way of vias 160. The die 104 may comprise multiple die bond pads 120. At least some of the bond fingers 118 and the die bond pads 120 may be electrically coupled using bond wires (not shown), such that electrical data signals may be transmitted between the die 104 and the substrate 100. The conducting plate 103 may be electrically coupled to the power ring 116 using bond wires 124. At least some of the die bond pads 120 may be electrically coupled to the conducting plate 103 using bond wires 126.

As mentioned above, the die 104 may require at least one voltage supply to function properly. The circuit board 144 is able to provide such a voltage supply to the die 104. Specifically, the solder balls 102 are electrically coupled to the circuit board 144. At least a portion of the solder balls 102 may transfer a voltage required by the die 104 from the circuit board 144 to the power metal plane 106 by way of the vias 140. In turn, the voltage may be transferred from the metal plane 108 to the power ring 116 by way of the vias 112 situated therebetween. From the power ring 116, the voltage may be transferred to the conducting plate 103 by way of the multiple bond wires 124. Although not required, in at least some embodiments, the bond wires 124 may be of a diameter substantially larger than that of fine-pitch bond wires used in the package 98 (e.g., approximately 50 micrometers). The power ring 116 and the conducting plate 103 preferably are coupled using as many bond wires 124 as is reasonably possible. In this way, the total wire inductance generated by the collection of bond wires 124 is substantially less than that of bond wires otherwise used.

The voltage supplied to the conducting plate 103 may be available to any portion of the die 104. To provide the voltage of the plate 103 to the die 104, any number of electrical connections may be established between the plate 103 and die bond pads 120 (i.e., using bond wires 126). Because the die 104 is provided a voltage supply with minimal use of bond wires and metal traces, the inductive effect caused by wires and metal traces between the substrate 100 and the die 104 also is minimized. In this way, signal integrity is preserved.

Figure 2A:
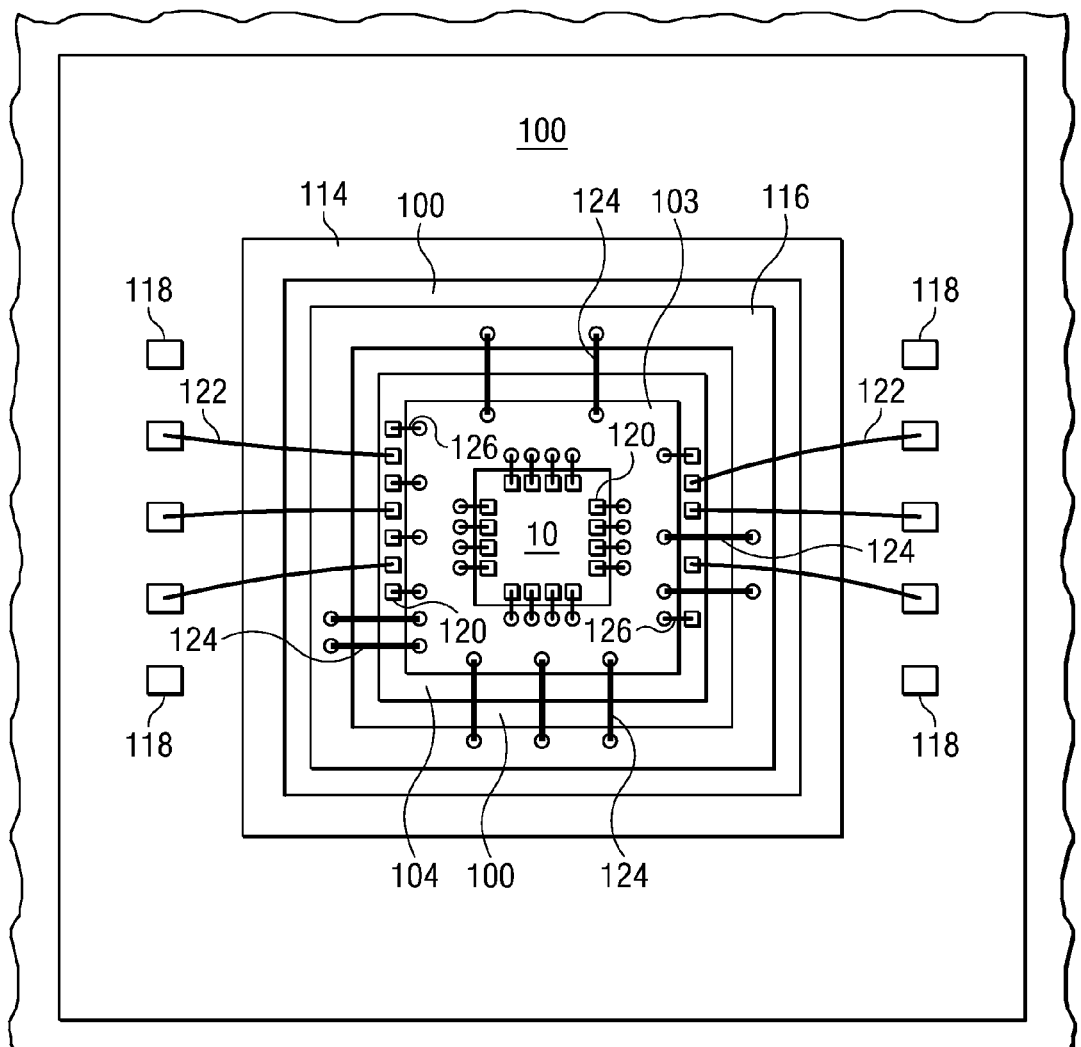
FIG. 2a shows a top-down view of the configuration of FIG. 1, in accordance with embodiments of the invention.

FIG. 2a shows a top-down view of the configuration of FIG. 1. In particular, FIG. 2a shows the substrate 100 abutting the power rings 114, 116, the bond fingers 118 and the die 104. The bond fingers 118 are electrically coupled to the multiple die bond pads 120 using bond wires 122 such that electrical data signals may be transferred therebetween. The die 104 abuts the supporting plate 105 (not visible from a top-down view) and multiple die bond pads 120. The supporting plate 105 abuts the conducting plate 103. As previously discussed, the plate 103 may be electrically coupled to the power ring 116 by way of multiple bond wires 124, wherein each of the bond wires 124 is of a diameter larger than that of fine-pitch bond wires used in the package 98. The plate 103 preferably is electrically coupled to the power ring 116 using as many bond wires 124 as is reasonably possible of as large a diameter as is reasonably possible, thus minimizing wire inductance. Although the conducting plate 103 is shown to be in the form of an annulus, the conducting plate 103 and the supporting plate 105 may be of any suitable shape and/or may be partitioned in any suitable fashion, per the power distribution requirements of the application.

As discussed in context of FIG. 1 above, voltage is provided to various bond pads 120 of the die 104 from the conducting plate 103. The conducting plate 103 is supplied with this voltage from the power ring 116 by way of multiple, substantially thick bond wires 124. The power ring 116 is supplied with the voltage from the metal plane 108 by way of the vias 112. The metal plane 106 is provided with the voltage by the solder balls 102 by way of the vias 142. The solder bumps 102 are provided with the voltage from the circuit board 144 coupled to the solder bumps 102 (not visible from a top-down view).

In the form of an annulus, the conducting plate 103 and the supporting plate 105 expose a core 10 of the die 104. The core 10 comprises a substantial portion of the circuitry of the die 104. Thus, exposing the core 10 to the conducting plate 103 as shown in FIG. 2a allows for multiple electrical connections to be made between the core 10 and the plate 103 without substantial difficulty and with minimal wire inductance effect, thus preserving signal integrity.

Figure 2B:
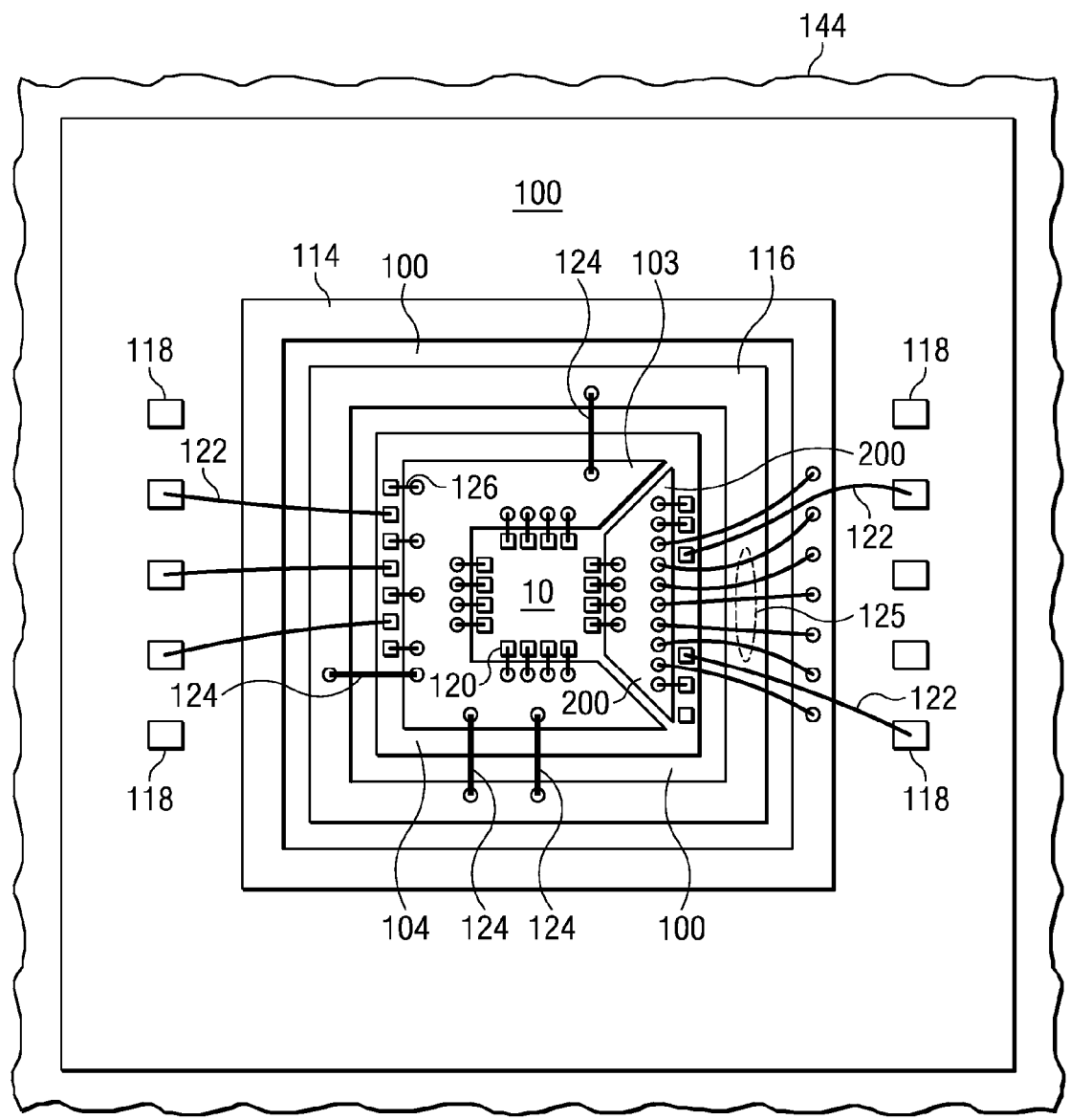
FIG. 2b shows a top-down view of a multiple metal apparatuses electrically coupled to a package substrate, in accordance with embodiments of the invention.

FIG. 2b shows an alternate configuration of the embodiment shown in FIG. 2a. Specifically, the configuration of FIG. 2b is substantially identical to that of FIG. 2a; however, a portion of the conducting plate 103 is detached from the conducting plate 103 to form a separate conducting plate 200. The conducting plate 200 holds a voltage potential different from that held by the conducting plate 103. For example, the conducting plate 103 may hold a potential of 1.0 V and the conducting plate 200 may hold a potential of 3.3 V. As described above, the conducting plate 103 is supplied with a voltage potential (e.g., 1.0 V) by way of multiple electrical connections to the power ring 116 using bond wires 124. Similarly, the conducting plate 200 is supplied with a voltage potential (e.g., 3.3 V) by way of multiple electrical connections to the power ring 114 using bond wires 125. The die 104 may access a 1.0 V supply by way of wirebonds between the conducting plate 103 and one or more bond pads 120. Similarly, the die 104 may access an 3.3 V supply by way of multiple wirebonds between the conducting plate 200 and one or more bond pads 120. In this way, two different voltage levels are made available to all portions of the die 104. The plates 103, 200 preferably are electrically coupled to the power rings 116, 114, respectively, using as many substantially-large-diameter bond wires 124, 125 as is reasonably possible, thereby minimizing wire inductance. Like the conducting plate 103, the conducting plate 200 may be substantially annular in shape (e.g., a rectangular, triangular, circular or irregular ring) and may be any electrically conductive device or apparatus.

Further separating the conducting plate 103 into multiple, individual conducting plates may provide the die 104 with even more voltage levels. Thus, a die 104 requiring voltages of 1V, 2V, 3V and 4V may be supplied with voltages of 1V, 2V, 3V and 4V by four separate conducting plates, each conducting plate supplied with a corresponding voltage by a separate power ring. Any number of voltage levels may be made available to the die 104 in this manner. Because the use of metal traces and fine-pitch bond wires is minimized, signal integrity is preserved.

Another exemplary embodiment in shown in FIG. 3. Specifically, FIG. 3 shows a cross-sectional side view of a package 298 (e.g., a tape-based cavity-down package) comprising a cavity-down package substrate 300 abutting multiple solder bumps 302, an annular supporting plate 303, multiple bond fingers 306, and power rings 308. A die 304 abuts the annular supporting plate 303 and die bond pads 312. An annular conducting plate 310 abuts the annular supporting plate 303. The annular conducting plate 310 may be any electrically conductive, ring-shaped structure (e.g., rectangular, circular, irregular, triangular). Part or all of the package 298 may be encapsulated in a mold compound (not shown). The solder bumps 302 are electrically coupled to a circuit board 314. Voltage supplies required by the die 304 are available on the circuit board 314. The solder bumps 302 transfer this voltage from the circuit board 314 to the power ring(s) 308 by way of a metal traces 316 in the substrate 300. A ground connection or some other voltage connection may be provided to the die 304 by way of a ground plane 317 and vias 319. The voltage/ground connections then are routed from the power rings 308 to the annular conducting plate 310 by way of bond wires 318. Once the voltage has been routed to the annular conducting plate 310, the die 304 may access the voltage from any of a variety of locations (i.e., by way of die bond pads 320).

Although only two bond wires 318 are shown, the plate 310 and the rings 308 preferably are coupled using as many bond wires 318 as is reasonably possible. Also, the bond wires 318 may be of a diameter substantially larger than that of fine-pitch bond wires used in the package 298. For these reasons, the wire inductance effect of the bond wires 318 is minimized. Because the use of metal traces is avoided, and because wire inductance effects are minimized, signal integrity is preserved.

FIG. 4a illustrates a cross-sectional side view of a supporting plate 400 that has been metallized with conducting material to form a conducting plate 402. The supporting plate 400 may be a flexible material or a rigid material that can be metallized by one of any number of techniques. For example, the supporting plate 400 may be fabricated using glass, silicon, plastic, polymer film or some other organic material and the conducting plate 402 may be formed by metallizing the supporting plate 400 (i.e., using a technique such as sputtering or electroplating) with a metal such as aluminum or copper or an alloy such as copper/nickel palladium gold. Other metals also may be used with a performance similar to that of the aforementioned metals, if applied with a sufficient thickness. In some embodiments, as shown in FIG. 4b, multiple conducting plates 402 may be stacked adjacent each other. Specifically, the configuration of FIG. 4b is substantially identical to the configuration of FIG. 4a; however, an extra conducting plate 404 is stacked adjacent the conducting plate 402 with a dielectric adhesive layer 406 situated therebetween. The conducting plate 404 may be used to provide an additional voltage level or ground connection to an adjacent die. Any number of conducting plates may be stacked in this manner. At least some of the conducting plates may be electrically-conductive, ring-shaped apparatuses (e.g., rectangular, irregular, triangular, circular, or a combination thereof).

Figure 5A:
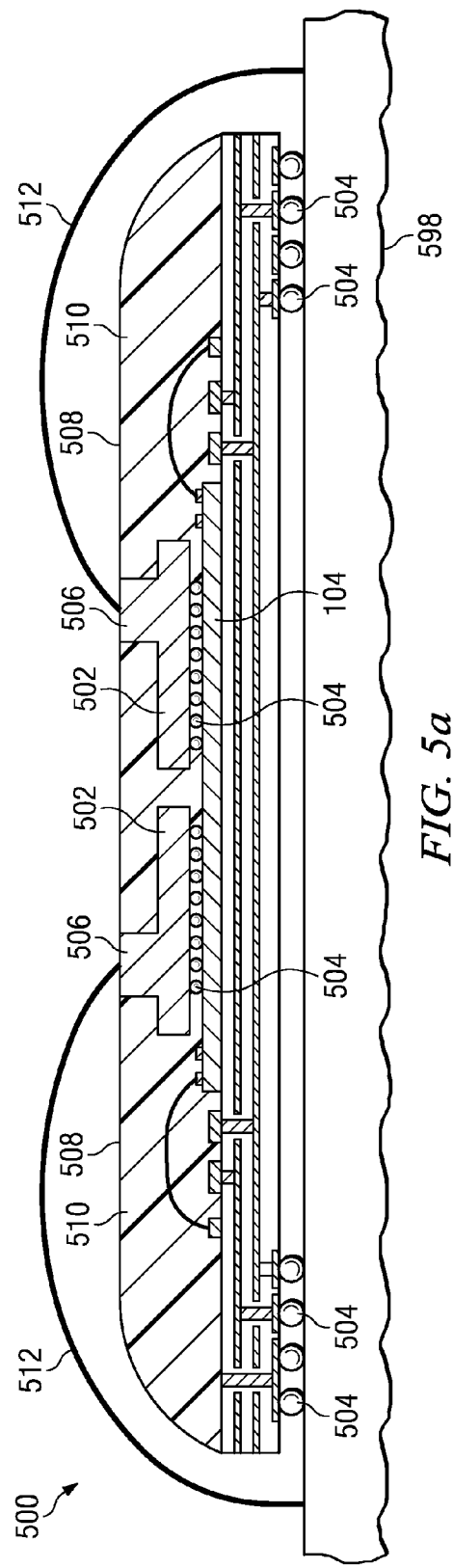
FIG. 5a shows a package substrate coupled to a metal apparatus having multiple protrusions, in accordance with embodiments of the invention.
Figure 5B:
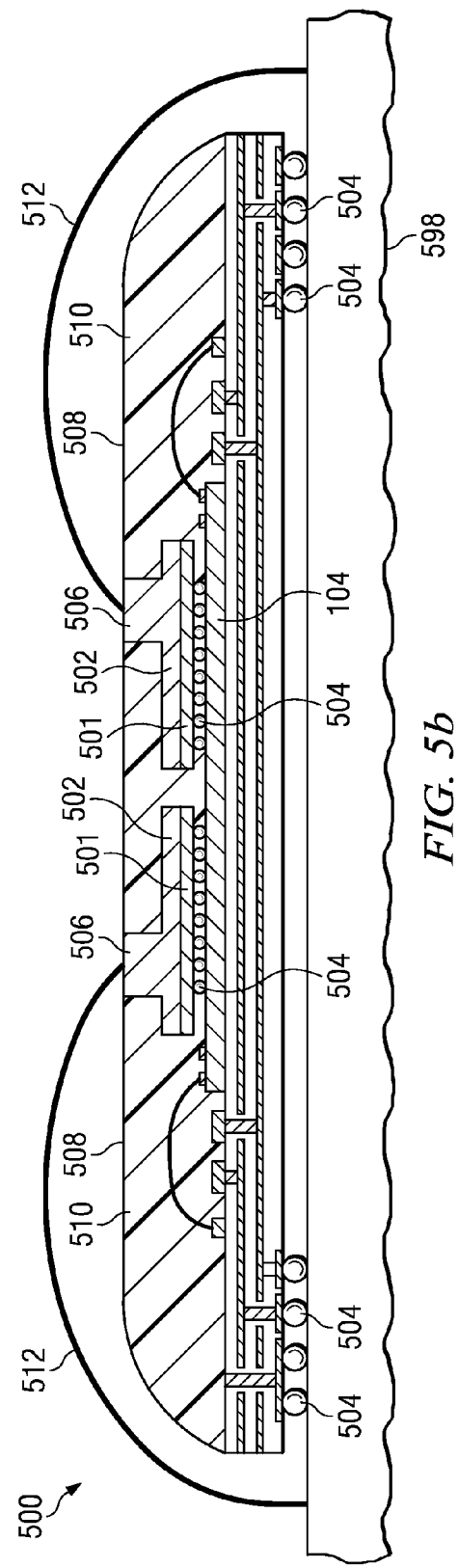
FIG. 5b shows a package substrate coupled to a supporting plate and a metal apparatus having multiple protrusions, in accordance with embodiments of the invention.

FIGS. 5a-5b show yet another exemplary embodiment of the invention. Specifically, FIG. 5a shows a package 500 that is substantially identical to the package 98 of FIG. 1. However, in FIG. 5a, the supporting plate 105 and conducting plate 104 are replaced with conducting plates 502. In some embodiments, the conducting plates 502 may be electrically coupled to the die 104 using a plurality of bump interconnects 504 (e.g., solder bumps, gold stud bumps). In other embodiments and as shown in FIG. 5b, the conducting plates 502 may rest abutting supporting plates 501, wherein the supporting plates 501 comprise a plurality of vias (not shown) and abut the interconnects 504. Thus, electrical signals may be transferred from the conducting plates 502 to the die 104 by way of the vias and the interconnects 504. An embodiment (e.g., as shown in FIGS. 5a-5b) may comprise any number of conducting plates 502. Because two conducting plates 502 are shown in FIGS. 5a-5b, a gap 599 also is shown to identify the separation between the plates 502.

In both the embodiments of FIGS. 5a and 5b, the conducting plates 502 comprise one or more protrusions 506. At least some of the protrusions 506 may range in width from approximately tens of microns to approximately hundreds of microns or more. Preferably, at least some of the protrusions 506 may be flush with a mold surface 508 of a mold layer 510. Alternatively, one or more of the protrusions 506 may protrude beyond the mold surface 508. The conducting plate 502 is supplied with voltage from a circuit board 598 abutting the interconnects 504 by way of one or more cables 512 coupled to the circuit board 598 and to one or more protrusions 506. A cable 512 may be a single wire or a multiple wire flexible strip cable. At least some of the cables 512 may have a diameter substantially larger than the diameter of a fine-pitch bond wire used in the package 500 (e.g., approximately 50 micrometers). In embodiments comprising multiple protrusions 506, the conducting plate 502 may be physically divided such that no two protrusions are electrically coupled to each other, as shown in FIGS. 5a and 5b. In this way, each protrusion 506 may carry a different voltage level. The voltage supplied to each protrusion 506 then is routed through a corresponding portion of the conducting plate 502 and through the interconnects 504 to the die 104. As in previously described embodiments, because the use of metal traces and fine-pitch bond wires is minimized, wire inductance also is minimized and signal integrity is preserved.

Although FIGS. 5a and 5b show the conducting plate 502 coupled to the die 104 using the interconnects 504, the scope of disclosure is not limited to this configuration. For example, in at least some embodiments, the conducting plate 502 may provide the die 104 with a voltage supply by way of bond wires (not shown) that may electrically couple at least some of the protrusions 506 to at least some of the die bond pads 120.

The conducting plates and supporting plates of FIGS. 1, 5a and 5b may be formed using any of a variety of techniques. In embodiments wherein a conducting plate is not coupled to a supporting plate, the conducting plate may be any solid, conducting apparatus and may be formed in any suitable manner. In embodiments comprising conducting plates with protrusions (i.e., as in FIGS. 5a and 5b), the protrusions may be formed using any appropriate technique or machine. However, in embodiments comprising a conducting plate coupled to a supporting plate, the plates may be fabricated using a metallization process as shown in FIG. 6. The process may begin with the optional fabrication of a supporting plate (block 600). The supporting plate may be made of any appropriate flexible or rigid material, such as glass, silicon, polymer film, plastic or other organic materials. The process may continue by metallizing the supporting plate with appropriate metal(s) to form a conducting plate (block 602). The plate may be metallized using any suitable technique, such as sputtering, chemical vapor deposition, electroplating, thermal evaporation, laminating, and so forth. Any of a variety of metals may be used, such as copper or aluminum. Metal alloys or stacks of metals/metal alloys also may be used, such as copper/aluminum and/or copper/nickel palladium gold. The metallization technique preferably does not damage or degrade the supporting plate material. The process continues by applying an optional, protective coating to the metallized plate (block 604). The coating provides mechanical and chemical protection to the metallized plate. The process continues further by optionally forming an aperture in the conducting and supporting plates to form annular plates (block 606). The annular plates may be any suitable shape, such as triangular, irregular, rectangular, circular, and/or a combination thereof. In this way, multiple electrical connections may later be established between the conducting plate and a core of a die adjacent the plates (i.e., as shown in FIGS. 2a and 2b). Finally, the process is completed by optionally forming protrusions in the conducting plate (block 608) as shown in FIGS. 5a and 5b. The protrusions may be formed using any suitable process, such as an additive process. In embodiments where the plate/protrusions are machined, the protrusions may be formed substantially simultaneously with the plates.

The above discussion is meant to be illustrative of the principles and various embodiments of the present invention. Numerous variations and modifications will become apparent to those skilled in the art once the above disclosure is fully appreciated. For example, although the subject matter above is primarily presented in context of cavity-up laminate packages, the various embodiments may be implemented in any suitable type of package, such as tape-based ball-grid array packages and MicroStar® ball-grid array packages. It is intended that the following claims be interpreted to embrace all such variations and modifications.

What is claimed is:

1. A method of distributing power in a semiconductor package, comprising:
    electrically coupling a conducting plate to a power source adjacent a substrate, said conducting plate abutting a supporting plate adjacent the substrate; and
    electrically coupling the conducting plate to bond pads on a die fixed between the supporting plate and the substrate using a plurality of bond wires.

2. The method of claim 1, wherein coupling the conducting plate to the supporting plate comprises using a conducting plate and a supporting plate that are substantially annular in shape.

3. The method of claim 1, wherein electrically coupling the conducting plate to bond pads on the die comprises using apertures in the conducting plate and the supporting plate.

4. The method of claim 1, wherein electrically coupling the conducting plate to bond pads on the die comprises electrically coupling the conducting plate to a core of the die.

5. The method of claim 1, wherein electrically coupling the conducting plate to the power source comprises electrically coupling the conducting plate to a circuit board.

* * * * *